(12) United States Patent
Takamine et al.

(10) Patent No.: US 10,256,793 B2
(45) Date of Patent: Apr. 9, 2019

(54) ELASTIC WAVE DETECTION

(71) Applicant: Murata Manufacturing Co., Ltd., Nagaokakyo-shi, Kyoto-fu (JP)

(72) Inventors: Yuichi Takamine, Nagaokakyo (JP); Takashi Yamane, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/596,079

(22) Filed: May 16, 2017

(65) Prior Publication Data

US 2017/0250674 A1  Aug. 31, 2017

Related U.S. Application Data

(63) Continuation of application No. PCT/JP2015/081771, filed on Nov. 11, 2015.

(30) Foreign Application Priority Data

Dec. 25, 2014  (JP) .................................. 2014-262899

(51) Int. Cl.
*H03H 9/64* (2006.01)
*H03H 9/145* (2006.01)
(Continued)

(52) U.S. Cl.
CPC ...... *H03H 9/6496* (2013.01); *H03H 9/02574* (2013.01); *H03H 9/02992* (2013.01);
(Continued)

(58) Field of Classification Search
CPC ........... H03H 9/64; H03H 9/725; H03H 9/145
(Continued)

(56) References Cited

U.S. PATENT DOCUMENTS 7,642,694 B2 * 1/2010 Kando ................ H03H 9/0222
310/313 R
8,049,395 B2 * 11/2011 Kando ................ H03H 9/0222
310/313 A
(Continued)

FOREIGN PATENT DOCUMENTS

EP 0823780 A1 * 2/1998 ............... H03B 5/32
JP 56-43818 A 4/1981
(Continued)

OTHER PUBLICATIONS

Official Communication issued in Korean Patent Application No. 10-2017-7017163, dated May 14, 2018.
(Continued)

*Primary Examiner* — Dean O Takaoka
(74) *Attorney, Agent, or Firm* — Keating & Bennett, LLP

(57) ABSTRACT

An elastic wave device includes a piezoelectric film and a high acoustic velocity member in which an acoustic velocity of a bulk wave propagating in the high acoustic velocity member is larger than an acoustic velocity of a main mode elastic wave propagating in the piezoelectric film, the piezoelectric film that is directly or indirectly laminated on the high acoustic velocity member, a first conductive film provided on the piezoelectric film, and a second conductive film that is provided on the piezoelectric film and on at least a portion of the first conductive film. A plurality of IDT electrodes including electrode fingers and busbars are provided on the piezoelectric film, at least electrode fingers of a plurality of IDT electrodes are defined by the first conductive film, and at least a portion of connection wiring with which the plurality of IDT electrodes are connected to each other is defined the second conductive film.

18 Claims, 10 Drawing Sheets

(51) Int. Cl.
*H03H 9/17* (2006.01)
*H03H 9/19* (2006.01)
*H03H 9/02* (2006.01)

(52) U.S. Cl.
CPC .......... *H03H 9/145* (2013.01); *H03H 9/1452* (2013.01); *H03H 9/178* (2013.01); *H03H 9/19* (2013.01); *H03H 9/6483* (2013.01)

(58) Field of Classification Search
USPC ......................................................... 333/193
See application file for complete search history.

(56) References Cited

U.S. PATENT DOCUMENTS

| | | | | |
|---|---|---|---|---|
| 2011/0241480 | A1* | 10/2011 | Nakano | H03H 9/02015 310/313 B |
| 2013/0229242 | A1* | 9/2013 | Takata | H03H 9/6483 333/193 |
| 2013/0285768 | A1 | 10/2013 | Watanabe et al. | |
| 2014/0203893 | A1* | 7/2014 | Kando | H03H 9/02574 333/187 |

FOREIGN PATENT DOCUMENTS

| | | | | |
|---|---|---|---|---|
| JP | 2000-183679 A | | 6/2000 | |
| JP | 2002-290182 A | | 10/2002 | |
| JP | 2009-182407 A | | 8/2009 | |
| JP | WO 2012063516 A1 | * | 5/2012 | ........... H03H 9/6483 |
| JP | WO 2013047433 A1 | * | 4/2013 | ......... H03H 9/02574 |
| KR | 10-2010-0007911 A | | 1/2010 | |
| KR | 10-2013-0086378 A | | 8/2013 | |
| WO | 2012/086639 A1 | | 6/2012 | |

OTHER PUBLICATIONS

Official Communication issued in International Patent Application No. PCT/JP2015/081771, dated Dec. 8, 2015.

* cited by examiner

ELASTIC WAVE DETECTION

CROSS REFERENCE TO RELATED APPLICATIONS

This application claims the benefit of priority to Japanese Patent Application No. 2014-262899 filed on Dec. 25, 2014 and is a Continuation application of PCT Application No. PCT/JP2015/081771 filed on Nov. 11, 2015. The entire contents of each application are hereby incorporated herein by reference.

BACKGROUND OF THE INVENTION

1. Field of the Invention

The present invention relates to elastic wave devices.

2. Description of the Related Art

Elastic wave devices haven been widely used in cellular phones and other suitable devices.

For example, an elastic wave filter disclosed in International Publication No. 2012/086639 includes a multilayer body in which a high acoustic velocity film, a low acoustic velocity film formed with an insulation material, and a piezoelectric film are laminated in that order. An interdigital transducer (IDT) electrode is provided on the piezoelectric film.

An acoustic velocity of a bulk wave propagating in the high acoustic velocity film is larger than an acoustic velocity of a main mode elastic wave propagating in the piezoelectric film. An acoustic velocity of the bulk wave propagating in the low acoustic velocity film is smaller than the acoustic velocity of the main mode elastic wave propagating in the piezoelectric film.

However, in the elastic wave filter disclosed in International Publication No. 2012/086639, because the thickness of the piezoelectric film is small and the low acoustic velocity film formed with the insulation material is provided under the piezoelectric film, electric charge is caused to stagnate in the process of forming the IDT electrode on the piezoelectric film, which causes surge breakdown to occur between an electrode finger and a busbar of the IDT electrode or the like in some case. As such, ripples are likely to be generated in a pass band of the elastic wave filter. In addition, frequencies at which the ripples are generated, the magnitude of the ripples, and other factors are likely to vary.

SUMMARY OF THE INVENTION

Preferred embodiments of the present invention provide elastic wave devices in which ripples are unlikely to be generated in a pass band.

An elastic wave device according to a preferred embodiment of the present invention includes a piezoelectric film, and a high acoustic velocity member in which an acoustic velocity of a bulk wave propagating in the high acoustic velocity member is larger than an acoustic velocity of a main mode elastic wave propagating in the piezoelectric film, the piezoelectric film is directly or indirectly laminated on the high acoustic velocity member, a first conductive film is provided on the piezoelectric film, and a second conductive film that is provided on the piezoelectric film and on at least a portion of the first conductive film, wherein a plurality of IDT electrodes including electrode fingers and busbars are provided on the piezoelectric film, at least the electrode fingers of the plurality of IDT electrodes are defined by the first conductive film, and at least a portion of connection wiring with which the plurality of IDT electrodes are connected to each other is defined by the second conductive film.

In an elastic wave device according to a preferred embodiment of the present invention, the piezoelectric film is directly laminated on the high acoustic velocity member.

In an elastic wave device according to a preferred embodiment of the present invention, a close contact layer is provided between the high acoustic velocity member and the piezoelectric film. In this case, adhesiveness between the high acoustic velocity member and the piezoelectric film is improved.

In an elastic wave device according to a preferred embodiment of the present invention, a low acoustic velocity film is laminated on the high acoustic velocity member and in which an acoustic velocity of a bulk wave propagating in the low acoustic velocity film is smaller than the acoustic velocity of the main mode elastic wave propagating in the piezoelectric film, wherein the piezoelectric film is indirectly laminated on the high acoustic velocity member with the low acoustic velocity film interposed therebetween.

In an elastic wave device according to a preferred embodiment of the present invention, all of the connection wiring is defined by the second conductive film. This makes it possible to reduce an area of the first conductive film, such that surge breakdown of the IDT electrode is unlikely to occur and ripples are unlikely to be generated in the pass band.

In an elastic wave device according to a preferred embodiment of the present invention, the connection wiring includes a first wiring section defined by the first conductive film, the first wiring section establishing connection between the IDT electrodes, an insulation film provided on the first wiring section is further included, and a portion of the second conductive film is provided on the insulation film. In this case, three-dimensional wiring in which the first wiring section and a portion of the second conductive film are laminated with the insulation film interposed therebetween is provided. This makes it possible to miniaturize the elastic wave device.

In an elastic wave device according to a preferred embodiment of the present invention, the electrode fingers and the busbars are defined by the first conductive film. In this case, the electrode fingers and the busbars are provided at the same time.

In an elastic wave device according to a preferred embodiment of the present invention, the electrode fingers are defined by the first conductive film, the busbars are defined by the second conductive film, and the busbars overlap with end portions of the electrode fingers. In this case, the area of the first conductive film is able to be reduced. With this, the surge breakdown of the IDT electrode is unlikely to occur and the ripples are unlikely to be generated in the pass band.

In an elastic wave device according to a preferred embodiment of the present invention, the high acoustic velocity member is defined by a high acoustic velocity film, and a support substrate provided on a surface of the high acoustic velocity film on the opposite side to a surface thereof on which the low acoustic velocity film is provided is further included. In this case, a high acoustic velocity member that is effectively capable of making it difficult for energy leakage of the elastic waves to occur is provided on the support substrate. With this, the Q-value is able to be effectively increased.

In an elastic wave device according to a preferred embodiment of the present invention, the high acoustic velocity member is defined by a high acoustic velocity substrate. In this case, the support substrate is able to be omitted, thus making it possible to achieve a reduction in the number of components and the cost. As such, the productivity is improved.

In an elastic wave device according to a preferred embodiment of the present invention, the elastic wave device is a ladder filter including a serial arm resonator and a parallel arm resonator, and at least one of the serial arm resonator and the parallel arm resonator includes the plurality of IDT electrodes. In this case, ripples are unlikely to be generated in a pass band of the ladder filter.

In an elastic wave device according to a preferred embodiment of the present invention, the elastic wave device is a longitudinally coupled resonator elastic wave filter. In this case, ripples are unlikely to be generated in a pass band of the longitudinally coupled resonator elastic wave filter.

In an elastic wave device according to a preferred embodiment of the present invention, the elastic wave device is a duplexer including a first band pass filter and a second band pass filter having pass band is different from a pass band of the first band pass filter, and at least one of the first and second band pass filters is an elastic wave device according to a preferred embodiment of the present invention. In this case, ripples are unlikely to be generated in the pass band of at least one of the first and second band pass filters in the duplexer.

According to various preferred embodiments of the present invention, elastic wave devices in which ripples are unlikely to be generated in the pass band are provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, the present invention will be described with reference to specific preferred embodiments of the present invention and with reference to the drawings.

It is to be noted that the preferred embodiments described in the present specification are merely examples and configurations thereof can be partially replaced or combined between different preferred embodiments.

Figure 1:
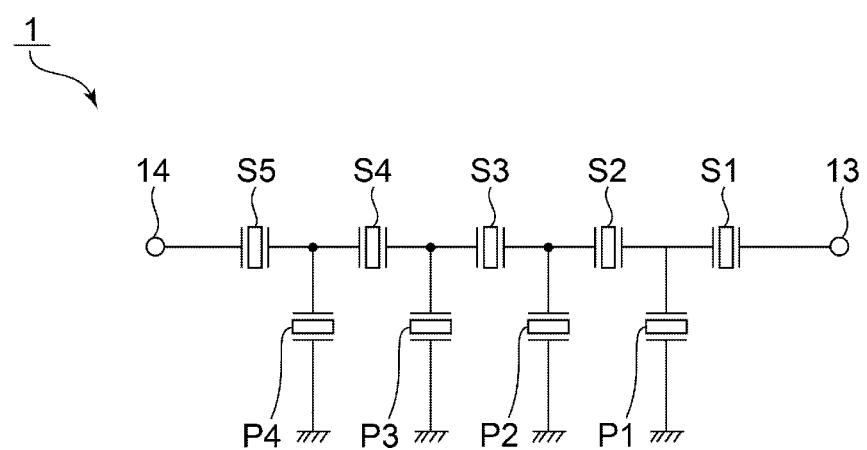
FIG. 1 is a circuit diagram of an elastic wave device according to a first preferred embodiment of the present invention.

FIG. 1 is a circuit diagram of an elastic wave device according to a first preferred embodiment of the present invention.

An elastic wave device 1 is a ladder filter including serial arm resonators S1 to S5 and parallel arm resonators P1 to P4. The serial arm resonators S1 to S5 are connected in series to each other between an input terminal 13 and an output terminal 14. A parallel arm resonator P1 is connected between a ground potential and a connection point between the serial arm resonator S1 and the serial arm resonator S2. A parallel arm resonator P2 is connected between the ground potential and a connection point between the serial arm resonator S2 and the serial arm resonator S3. A parallel arm resonator P3 is connected between the ground potential and a connection point between the serial arm resonator S3 and the serial arm resonator S4. A parallel arm resonator P4 is connected between the ground potential and a connection point between the serial arm resonator S4 and the serial arm resonator S5.

Hereinafter, a more specific configuration of the elastic wave device 1 will be described with reference to FIGS. 2 and 3.

Figure 2:
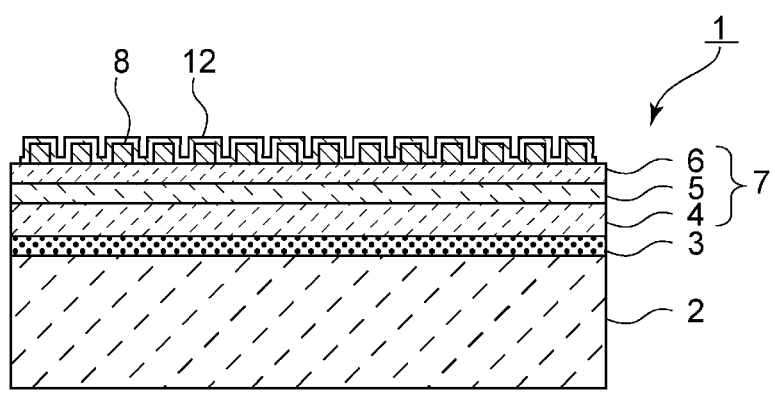
FIG. 2 is a schematic cross-sectional front view of the elastic wave device according to the first preferred embodiment of the present invention.

FIG. 2 is a schematic cross-sectional front view of the elastic wave device according to the first preferred embodiment of the present invention.

The elastic wave device 1 includes a support substrate 2. The support substrate 2 is preferably made of Si, for example. The support substrate 2 may be made of a material other than Si.

A bonding film 3 is laminated on the support substrate 2. The bonding film 3 bonds the support substrate 2 to a high acoustic velocity film 4 as a high acoustic velocity member to be explained later. The bonding film 3 is preferably made of $SiO_2$, for example. The bonding film 3 may be made of a material other than $SiO_2$ as long as the material is sufficiently capable of bonding both of the support substrate 2 and the high acoustic velocity film 4. Although it is not absolutely necessary to provide the bonding film 3, it is preferable to provide the bonding film 3 because the bonding between the support substrate 2 and the high acoustic velocity film 4 is effectively strengthened.

The high acoustic velocity film 4 is laminated on the bonding film 3. An acoustic velocity of a bulk wave propagating in the high acoustic velocity film 4 is larger than an acoustic velocity of a main mode elastic wave propagating in a piezoelectric film 6 to be explained later. The high acoustic velocity film 4 is preferably made of SiN, for example. The high acoustic velocity film 4 may be made of a material whose major ingredient is, for example, aluminum nitride, aluminum oxide, silicon carbide, silicon oxynitride, a DLC film, diamond, or other suitable materials as long as the material is a material having a relatively high acoustic velocity.

The acoustic velocity of a bulk wave is an acoustic velocity determined by the inherent nature of a material, and there exist a P wave vibrating in a wave travelling direction, that is, in a longitudinal direction and an S wave vibrating in a transverse direction which is a direction perpendicular or substantially perpendicular to the wave travelling direction. The bulk wave propagates in any of the piezoelectric film, the high acoustic velocity film, and the low acoustic velocity film. In the case of an isotropic material, the P wave and the S wave exist. In the case of an anisotropic material, the P wave, a low-velocity S wave, and a high-velocity S wave exist. In the case where a surface acoustic wave is excited using the anisotropic material, an SH (Shear Horizontal) wave and an SV (Shear Vertical) wave are generated as two S waves. In the present specification, an acoustic velocity of a main mode elastic wave propagating in the piezoelectric film refers to a mode, among the three modes including the P wave, the SH wave, and the SV wave, that is used to obtain a pass band as a filter, resonance characteristics as a resonator, or other desired characteristics.

A low acoustic velocity film 5 is laminated on the high acoustic velocity film 4. An acoustic velocity of a bulk wave propagating in the low acoustic velocity film 5 is smaller than the acoustic velocity of the main mode elastic wave propagating in the piezoelectric film 6 to be explained later. The low acoustic velocity film 5 is preferably made of $SiO_2$, for example. The low acoustic velocity film 5 may be made of a material whose major ingredient is a compound in which fluorine, carbon, boron, or other suitable material is added to glass, silicon oxynitride, tantalum oxide, or silicon oxide, for example, as long as the material is a material having a relatively low acoustic velocity.

The piezoelectric film 6 is laminated on the low acoustic velocity film 5. The piezoelectric film 6 is preferably made of a $LiTaO_3$ film with a cut-angle of 50°, for example. The cut-angle of the piezoelectric film 6 is not specifically limited to this value. The piezoelectric film 6 may be made of a piezoelectric single crystal of $LiNbO_3$ or other piezoelectric materials other than $LiTaO_3$, for example. Alternatively, the piezoelectric film 6 may be made of piezoelectric ceramics.

As discussed above, on the support substrate 2 and the bonding film 3, a multilayer body 7 is provided in which the high acoustic velocity film 4, the low acoustic velocity film 5, and the piezoelectric film 6 are laminated in that order. In the present preferred embodiment, the thickness of the support substrate 2 is preferably about 200 μm, for example. The thickness of the bonding film 3 is preferably about 1800 nm, for example. The thickness of the high acoustic velocity film 4 is preferably about 1345 nm, for example. The thickness of the low acoustic velocity film 5 is preferably about 670 nm, for example. The thickness of the piezoelectric film 6 is preferably about 600 nm, for example. Note that the respective thicknesses of the support substrate 2, the bonding film 3, the high acoustic velocity film 4, and the low acoustic velocity film 5 are not specifically limited to these values.

Figure 16:
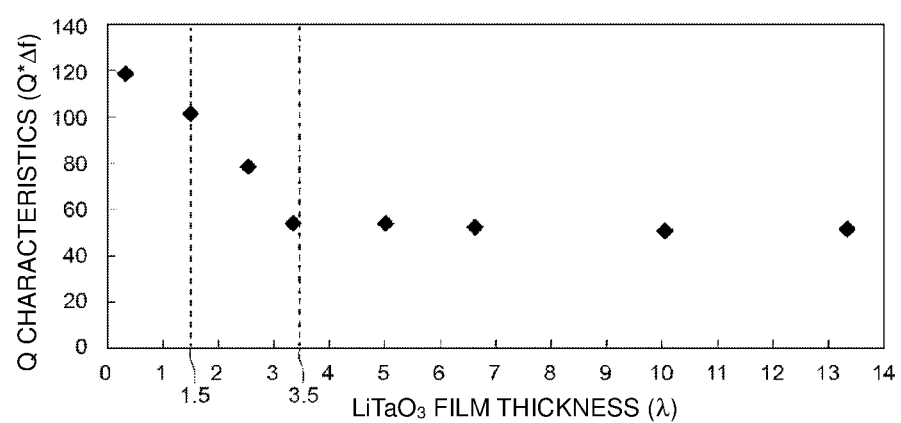
FIG. 16 is a graph illustrating a relationship between a $LiTaO_3$ film thickness and a Q-value in an elastic wave device.

Meanwhile, where a wavelength defined by an electrode finger pitch of an IDT electrode 8 to be explained later is denoted as λ, it is preferable for the thickness of the piezoelectric film to be no more than about 3.5λ, for example. This will be explained with reference to FIG. 16. FIG. 16 is a graph illustrating a relationship between a $LiTaO_3$ film thickness and a Q-value in a structure in which a low acoustic wave film made of a $SiO_2$ film with a thickness of about 0.35λ and a piezoelectric film made of $LiTaO_3$ with Euler Angles (0°, 140.0°, 0°), in other words, with a cut-angle of 90° are laminated on a high acoustic velocity support substrate formed with silicon. As is apparent from FIG. 16, where the $LiTaO_3$ film thickness is no more than about 3.5λ, it is understood that the Q-value is higher than that in a case where the thickness exceeds about 3.5λ. Therefore, it is preferable for the $LiTaO_3$ film thickness to be no more than about 3.5λ, and it is more preferable to be no more than about 1.5λ, for example.

The IDT electrode 8 is provided on the piezoelectric film 6. The IDT electrode 8 is an IDT electrode of the serial arm resonator S1 shown in FIG. 1. Hereinafter, as a representative example, a configuration of the serial arm resonator S1 will be described.

Figure 3:
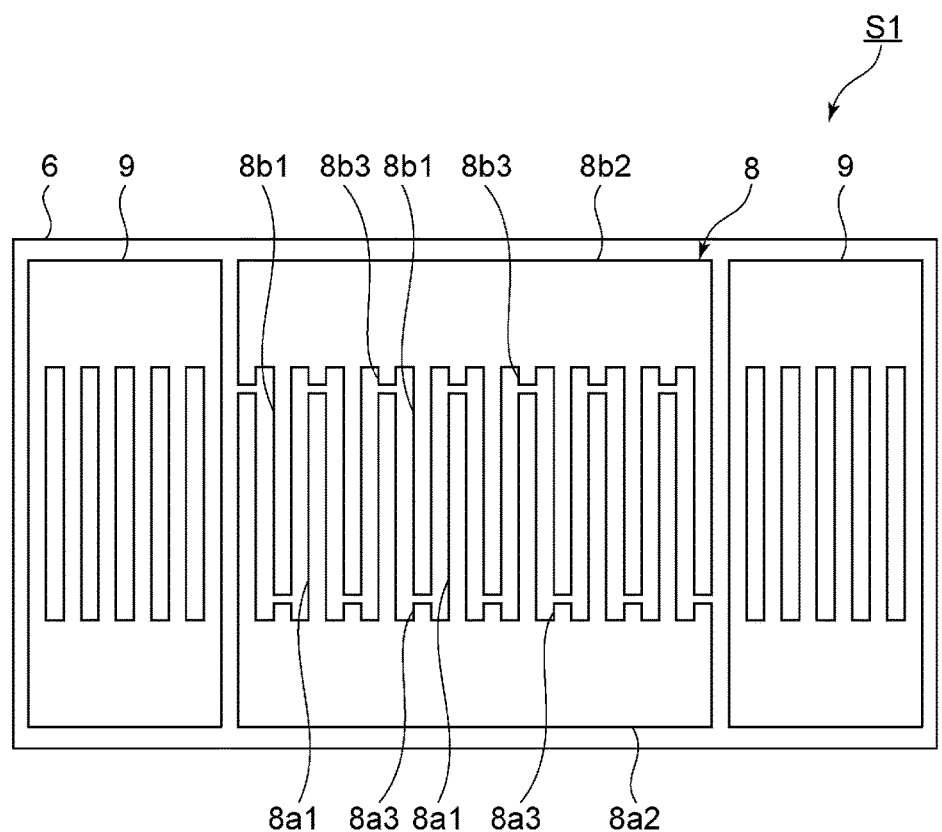
FIG. 3 is a schematic plan view of a serial arm resonator according to the first preferred embodiment of the present invention.

FIG. 3 is a schematic plan view of a serial arm resonator in the first preferred embodiment of the present invention. Note that FIG. 3 is a schematic plan view of the serial arm resonator in which a protection film to be explained later is omitted.

Reflectors 9 are provided on both sides in the surface acoustic wave propagation direction of the IDT electrode 8, so as to provide the serial arm resonator S1.

The IDT electrode 8 includes a plurality of first electrode fingers 8a1, a plurality of second electrode fingers 8b1, and first and second busbars 8a2, 8b2. The plurality of first electrode fingers 8a1 and the plurality of second electrode fingers 8b1 are alternately interleaved with each other. One end of each of the plurality of first electrode fingers 8a1 is common-connected to the first busbar 8a2. One end of each of the plurality of second electrode fingers 8b1 is common-connected to the second busbar 8b2. The IDT electrode 8 further includes a plurality of first dummy electrodes 8a3 and a plurality of second dummy electrodes 8b3. One end of each of the plurality of first dummy electrodes 8a3 is common-connected to the first busbar 8a2. The plurality of first dummy electrodes 8a3 oppose the plurality of second electrode fingers 8b1. One end of each of the plurality of second dummy electrodes 8b3 is common-connected to the second busbar 8b2. The plurality of second dummy electrodes 8b3 oppose the plurality of first electrode fingers 8a1. Note that in the present specification, the electrode fingers and busbars are collectively referred to as an "IDT electrode".

The IDT electrode 8 is preferably a multilayer body in which an Al—Cu alloy containing about 1 wt % of Cu is laminated on Ti, for example. The thickness of Ti is preferably about 12 nm, and the thickness of the Al—Cu alloy is preferably about 162 nm, for example. The IDT electrode 8 may have a multilayer structure other than the above-described structure, or have a single-layered structure.

As shown in FIG. 2, a protection film 12 is provided on the IDT electrode 8. Preferably, the protection film 12 is made of $SiO_2$ and the thickness thereof is about 25 nm, for example. The protection film 12 may be made of a material other than $SiO_2$, and the thickness thereof is not specifically limited to the above value. Although it is not absolutely necessary to provide the protection film 12, it is preferable to provide the protection film 12 because the IDT electrode 8 is less likely to be broken.

The serial arm resonators S2 to S5 and the parallel arm resonators P1 to P4, similarly to the serial arm resonator S1, include IDT electrodes and reflectors. The IDT electrodes and the reflectors of the serial arm resonators S1 to S5 and the parallel arm resonators P1 to P4 are each defined by a first conductive film to be explained later.

Energy of elastic waves is concentrated in a low acoustic velocity medium. In the present preferred embodiment, since the high acoustic velocity film 4, the low acoustic velocity film 5, and the piezoelectric film 6 are laminated in that order, energy of elastic waves is confined in the low acoustic velocity film 5 and the piezoelectric film 6. Accordingly, the energy of elastic waves is unlikely to leak to the support substrate 2 side. This makes it possible to increase the Q-value.

Figure 4:
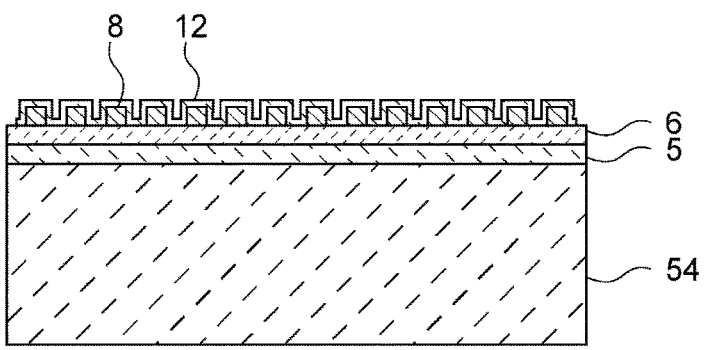
FIG. 4 is a schematic cross-sectional front view of an elastic wave device according to a variation of the first preferred embodiment of the present invention.

In a variation shown in FIG. 4, a high acoustic velocity substrate 54, instead of not a high acoustic velocity film, may be used as the high acoustic velocity member. The high acoustic velocity substrate 54 is preferably made of Si or other suitable material, for example. The high acoustic velocity substrate 54 may be made of a material other than Si as long as an acoustic velocity of the bulk wave propagating therein is larger than the acoustic velocity of the main mode elastic wave propagating in the piezoelectric film 6. The energy of elastic waves is confined in the low acoustic velocity film 5 and piezoelectric film 6 even if the high acoustic velocity substrate 54 is used. In addition, the support substrate 2 shown in FIG. 2 is able to be omitted. This makes it possible to reduce the number of components and the cost. As such, the productivity is effectively improved. Note that, however, it is preferable that the high acoustic velocity film 4 made of a member capable of making it more difficult for the elastic wave energy to leak be provided on the support substrate 2 as in the present preferred embodiment. With this, the Q-value is able to be further increased.

A close contact layer may be provided between the high acoustic velocity film 4 and the piezoelectric film 6. Providing the close contact layer makes it possible to enhance adhesiveness between the high acoustic velocity film 4 and the piezoelectric film 6. It is sufficient for the close contact layer to be made of resin or metal, and an epoxy resin, polyimide resin, or other suitable material may preferably be used, for example.

Hereinafter, a more specific configuration of the elastic wave device 1 will be described with reference to FIGS. 5 and 6.

Figure 5:
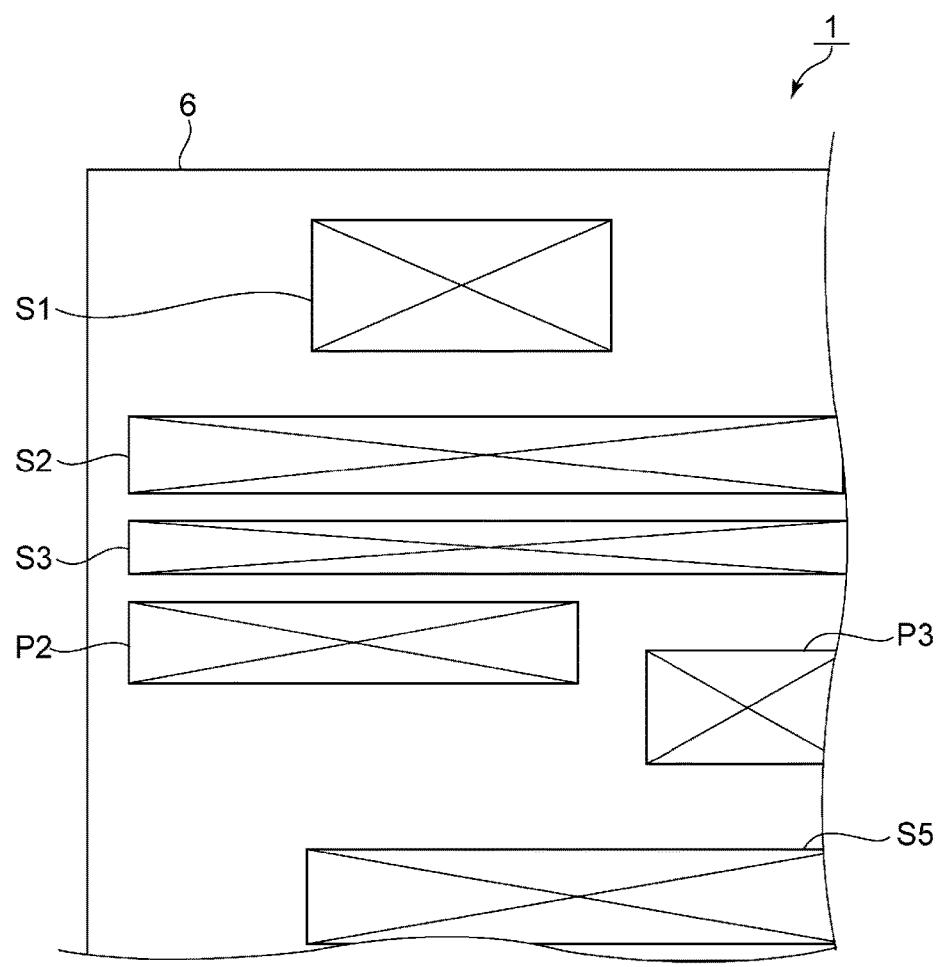
FIG. 5 is a partially cutout plan view schematically illustrating a state in which a first conductive film is provided on a piezoelectric film according to the first preferred embodiment of the present invention.
Figure 6:
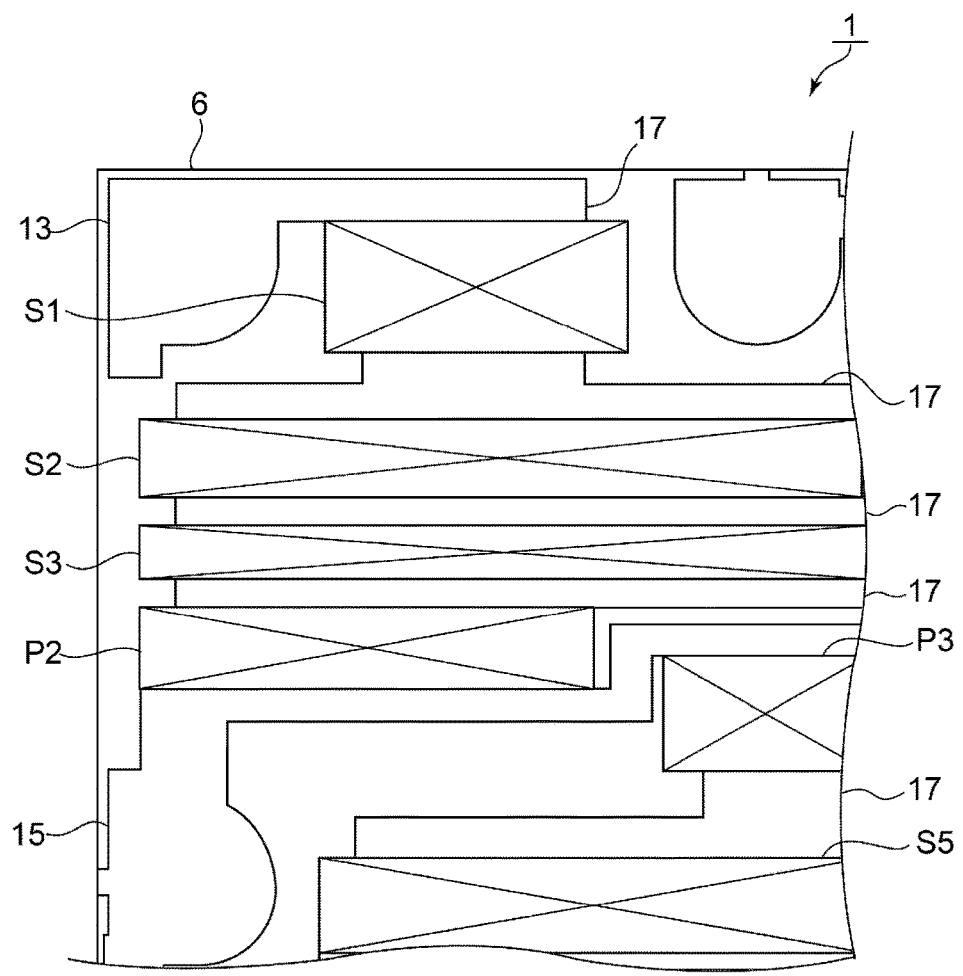
FIG. 6 is a partially cutout plan view schematically illustrating the elastic wave device according to the first preferred embodiment of the present invention.

FIG. 6 is a partially cutout plan view schematically illustrating the elastic wave device according to the present preferred embodiment. FIG. 5 is a partially cutout plan view schematically illustrating a state in which a manufacture process of the elastic wave device of the preferred embodiment is in a midway stage. More specifically, FIG. 5 is a partially cutout plan view schematically illustrating a state in which the first conductive film is provided on the piezoelectric film. Note that FIG. 6 is a partially cutout plan view in which the protection film is omitted.

In FIGS. 5 and 6, as well as in FIGS. 7, 8 and FIGS. 10 to 13 to be described later, the serial arm resonators, the parallel arm resonators, the IDT electrodes, and reflectors are each indicated by a schematic illustration of a rectangle in which two diagonal lines are drawn.

As shown in FIG. 5, the serial arm resonators S1, S2, S3 and S5, and the parallel arm resonators P2, P3 are provided on the piezoelectric film 6. Although not shown in FIG. 5, the serial arm resonator S4 and the parallel arm resonators P1, P4 shown in FIG. 1 are also provided on the piezoelectric film 6. In other words, on the piezoelectric film 6, the respective IDT electrodes and reflectors of the serial arm resonators S1 to S5 and the parallel arm resonators P1 to P4 are provided. The above-mentioned IDT electrodes and reflectors are each defined by the first conductive film provided on the piezoelectric film. In the present preferred embodiment, in a process after providing the first conductive film, a second conductive film is provided on the piezoelectric film 6 and a portion of the first conductive film. A configuration in which the second conductive film is provided is shown in FIG. 6.

As shown in FIG. 6, the input terminal 13, a ground terminal 15, and connection wiring 17 are provided on the piezoelectric film 6. Although not illustrated, an output terminal is also provided on the piezoelectric film 6. The input terminal 13, the output terminal, the ground terminal 15, and the connection wiring 17 are each defined by the second conductive film.

The connection wiring 17 connects the serial arm resonator S1 and the serial arm resonator S2. Likewise, the connection wiring 17 connects the serial arm resonators S1 to S5 shown in FIG. 1, connects the parallel arm resonators P1 to P4 shown in FIG. 1, and establishes connection between the input terminal 13 and the output terminal 14 also shown in FIG. 1. The parallel arm resonators P1 to P4 are connected to the ground terminal 15 by the connection wiring 17. The ground terminal 15 is connected to the ground potential. In this manner, the circuit shown in FIG. 1 is provided.

The connection wiring 17 is defined by the second conductive film, and includes a portion that is not laminated on the first conductive film. As shown in FIG. 5, in the stage in which the serial arm resonators S1, S2, S3 and S5, as well as the parallel arm resonators P2 and P3, are laminated on the piezoelectric film 6, the connection wiring 17 shown in FIG. 6 is not provided. Note that the connection wiring 17 may include a film other than the second conductive film as long as the film includes a portion that is not laminated on the first conductive film. For example, an insulation film or other suitable film may be laminated.

The second conductive film extends to the upper portion of the first and second busbars 8a2 and 8b2 of the IDT electrode 8 of the serial arm resonator S1 as shown in FIG. 3. The second conductive film likewise extends to the upper portion of the busbars of the IDT electrode of each of the serial arm resonators S2 to S5 and the parallel arm resonators P1 to P4. This makes it possible to reduce the electrical resistance. The second conductive film may not extend to the upper portion of the busbars.

When forming the first conductive film and the second conductive film on the piezoelectric film 6, a metal film is formed on the piezoelectric film 6 by a CVD method or a sputtering method, for example. Subsequently, patterning is performed on the metal film by a photolithography method or other suitable method so as to obtain the first conductive film. At this time, the IDT electrodes and reflectors of the serial arm resonators S1 to S5 and the parallel arm resonators P1 to P4 shown in FIG. 1 are provided.

Next, a resist pattern is formed on the piezoelectric film 6 and the first conductive film by the photolithography method or other suitable method, for example. Subsequently, a metal film is formed on the entire surface by the CVD method, the sputtering method, or other suitable method. Then, patterning is performed on the metal film by removing the resist pattern, thus obtaining the second conductive film. At this time, the input terminal 13, the output terminal 14, the ground terminal 15, and the connection wiring 17 are provided.

In the present preferred embodiment, the connection wiring 17 is defined by the second conductive film. With this, ripples are unlikely to be generated in the pass band, which will be explained below.

Figure 7:
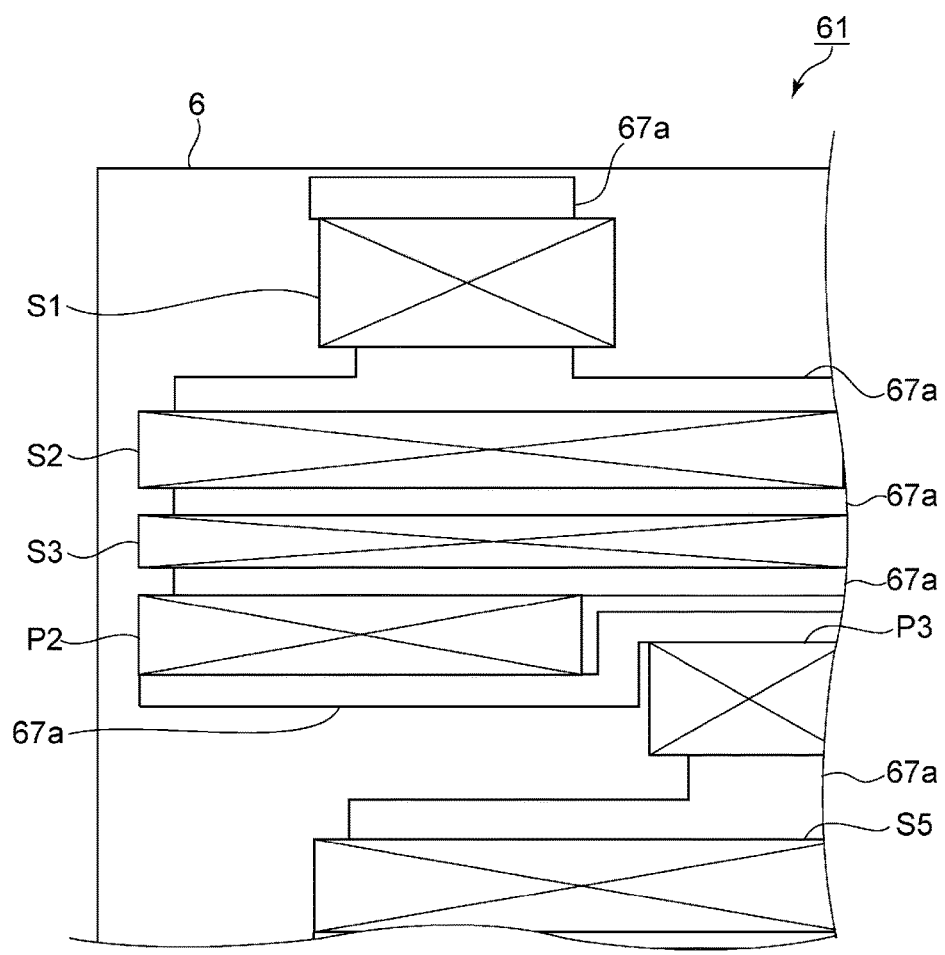
FIG. 7 is a partially cutout plan view schematically illustrating a state in which a first conductive film is provided on a piezoelectric film according to a comparative example.
Figure 8:
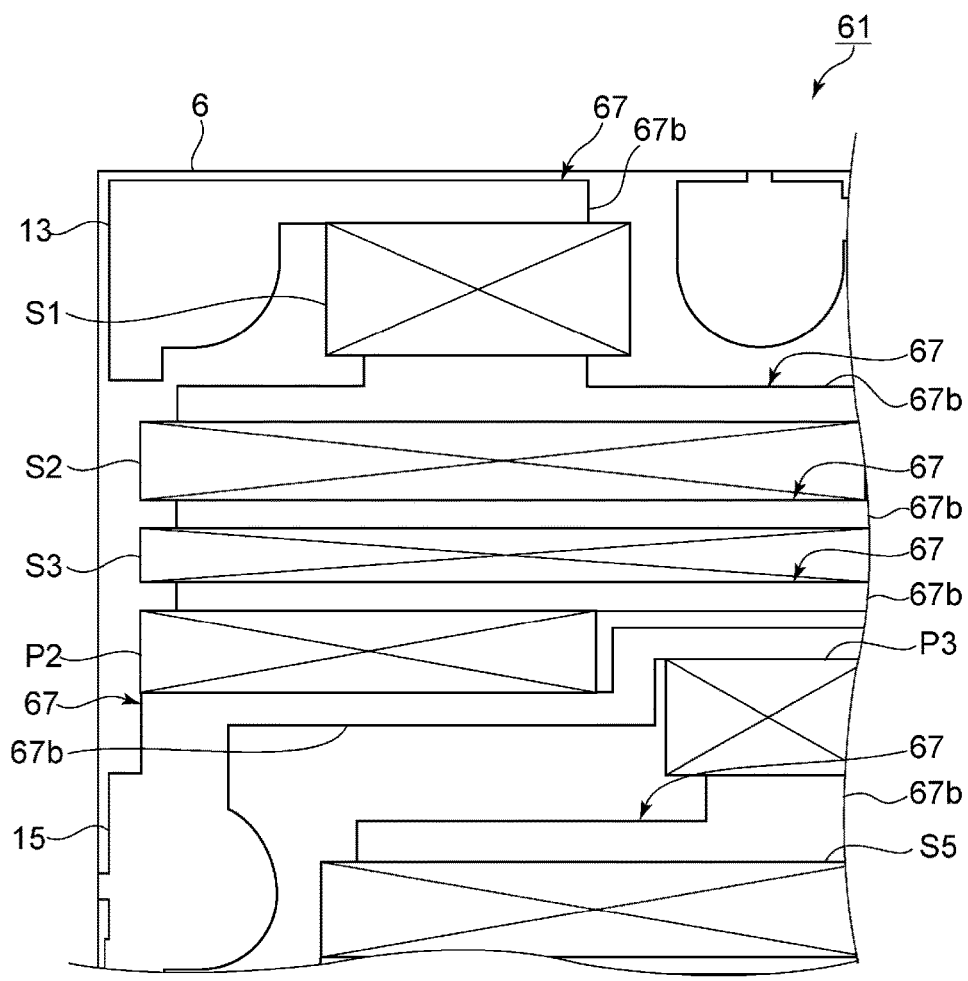
FIG. 8 is a partially cutout plan view schematically illustrating an elastic wave device of the comparative example.

FIG. 8 is a partially cutout plan view schematically illustrating an elastic wave device of a comparative example. FIG. 7 is a partially cutout plan view schematically illustrating a state in which a manufacture process of the elastic wave device of the comparative example is in a midway stage. To be more specific, FIG. 7 is a partially cutout plan view schematically illustrating a state in which a first conductive film is provided on a piezoelectric film.

Connection wiring 67 of an elastic wave device 61 of the comparative example as shown in FIG. 8 is a multilayer body in which the first conductive film and a second conductive film are laminated so as to be in contact with each other. More specifically, the connection wiring 67 includes a first wiring section 67a defined by the first conductive film as shown in FIG. 7 and a second wiring section 67b defined by the second conductive film as shown in FIG. 8. Except for this difference, the elastic wave device 61 of the comparative example is a ladder filter having the same or substantially the same configuration as that of the first preferred embodiment.

In an elastic wave device including a multilayer body in which a high acoustic velocity film, a low acoustic velocity film, and a piezoelectric film are laminated in that order, the piezoelectric film is laminated on the low acoustic velocity film made of an insulation material. Because of this, electric charge is likely to accumulate on electrodes in a process of forming the electrodes on the piezoelectric film. In addition, as shown in FIG. 7, in the comparative example, at the same time as when the IDT electrodes of the serial arm resonators S1, S2, S3 and S5 and the parallel arm resonators P2, P3 are provided, the first wiring section 67a is also provided. Because of this, a surface area of the first conductive film is large. As such, an amount of electric charge accumulating on the first conductive film is large. In the first conductive film, an opposing area between an end surface of a leading end of the electrode finger of the IDT electrode and an opposing portion with respect to the end surface is particularly small. This causes electric charge to be accumulated on the opposing portion. In addition, a distance between the end surface of the leading end of the electrode finger of the IDT electrode and the opposing portion with respect to the end surface is short. As such, in the comparative example, a surge breakdown is likely to occur in the opposing portion of the IDT electrode.

The surge breakdown is more likely to occur as a surface area of each of the electrodes that are simultaneously formed increases. Further, the IDT electrode surge breakdown is more likely to occur as a minimum value of the opposing area of the opposing portion decreases. Therefore, as an area ratio represented below increases, the IDT electrode surge breakdown is more likely to occur.

(Thickness of IDT electrode and electrodes formed simultaneously with IDT electrode×Circumference length of IDT electrode and electrodes formed simultaneously with IDT electrode)/Minimum opposing area in IDT electrode In the comparative example, because the area ratio is large, the surge breakdown is caused in the opposing portion of the IDT electrode in some cases. Due to this, there is a case in which ripples are generated in a pass band of the elastic wave device 61. The generation frequency and magnitude of the ripples is likely to vary in the comparative example.

On the contrary, in the present preferred embodiment, the connection wiring 17 shown in FIG. 6 is defined by the second conductive film. In other words, at the time of forming the IDT electrode, the connection wiring 17 has not yet been formed. This makes it possible to reduce the surface area of the IDT electrode and the electrodes formed simultaneously with the IDT electrode. As such, the above-described area ratio is able to be made small. Accordingly, the IDT electrode surge breakdown is unlikely to occur and the ripples are unlikely to be generated in the pass band.

In the present preferred embodiment, among the end surfaces of the respective leading ends of the plurality of first and second electrode fingers 8a1, 8b1 and the plurality of first and second dummy electrodes 8a3 and 8b3 as shown in FIG. 3, the minimum end surface area corresponds to the minimum opposing area of the above area ratio. In the case where the first and second dummy electrodes are not provided, among the end surfaces of the respective leading ends of the plurality of first and second electrode fingers, the minimum end surface area corresponds to the minimum opposing area of the above area ratio.

Figure 9:
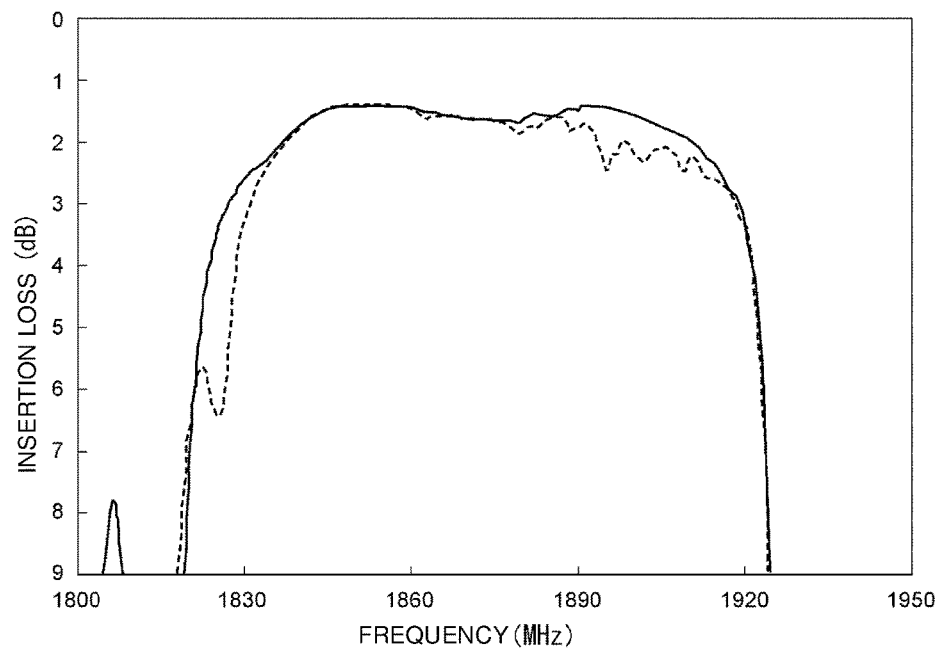
FIG. 9 is a graph illustrating frequency characteristics in a pass band of each of the elastic wave devices according to the first preferred embodiment of the present invention and the comparative example.

FIG. 9 is a graph illustrating frequency characteristics in a pass band of each of the elastic wave devices of the first preferred embodiment of the present invention and the comparative example. A solid line indicates the frequency characteristics of the first preferred embodiment, while a broken line indicates the frequency characteristics of the comparative example.

As shown in FIG. 9, ripples are generated in the pass band in the comparative example. On the other hand, no ripple is generated in the pass band in the present preferred embodiment. As discussed above, it is understood that ripples are unlikely to be generated in the pass band in the present preferred embodiment.

Figure 15:
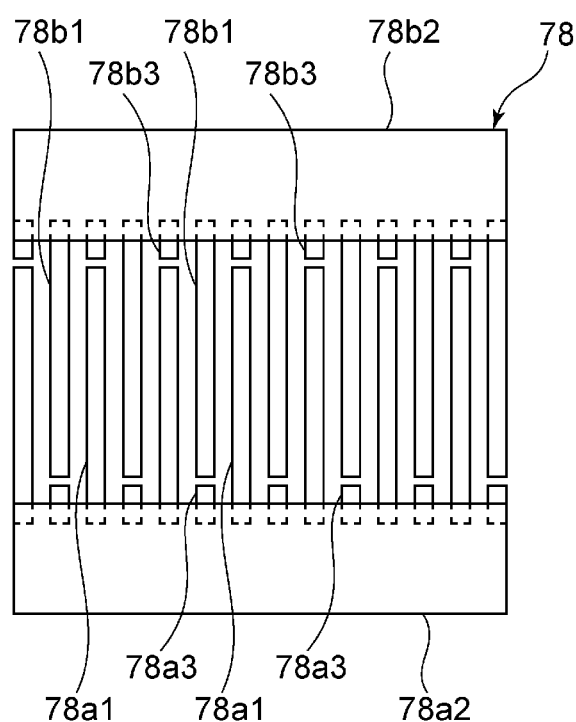
FIG. 15 is a schematic plan view illustrating a variation of an IDT electrode according to the first preferred embodiment of the present invention.

In FIGS. 5 and 6, a structure is illustrated in which the connection wiring 17 that connects the serial arm resonators to each other or connects the resonators to an external terminal is defined by the second conductive film, and includes a portion that is not laminated on the first conductive film. Note that, as shown in FIG. 15, first and second busbars 78a2 and 78b2 of an IDT electrode 78 may be defined by the second conductive film. In other words, the first busbar 78a2 is defined by the second conductive film, and first electrode fingers 78a1 are each defined by the first conductive film. The first busbar 78a2 overlaps with an end portion of each of the first electrode fingers 78a1. With this arrangement, the respective first electrode fingers 78a1 are connected by the first busbar 78a2. Likewise, the second busbar 78b2 is defined by the second conductive film, and second electrode fingers 78b1 are each defined by the first conductive film. The second busbar 78*b*2 overlaps with an end portion of each of the second electrode fingers 78*b*1. The respective second electrode fingers 78*b*1 are connected by the second busbar 78*b*2. In this manner, by structuring the first and second busbars 78*a*2 and 78*b*2 so that the busbars include portions that are not laminated on the first and second electrode fingers 78*a*1 and 78*b*1, the area of the first conductive film is reduced. This makes it possible to obtain the same effects as the first preferred embodiment.

Note that in FIG. 15, first and second dummy electrodes 78*a*3 and 78*b*3 defined by the first conductive film are also provided.

A second preferred embodiment of the present invention will be described with reference to FIGS. 10 and 11.

Figure 10:
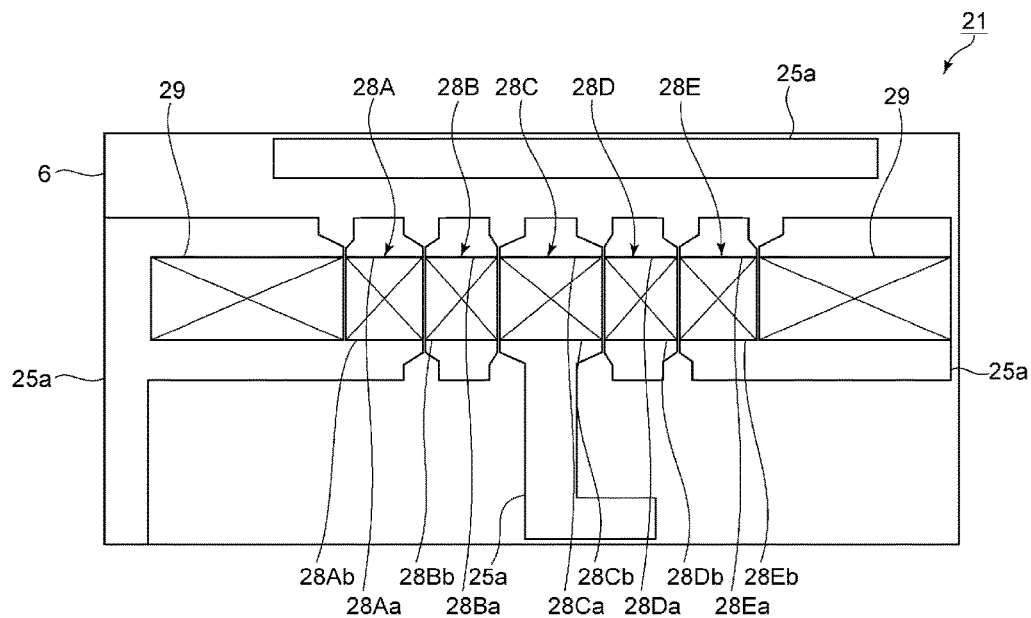
FIG. 10 is a partially cutout plan view schematically illustrating a state in which a first conductive film is provided on a piezoelectric film according to a second preferred embodiment of the present invention.
Figure 11:
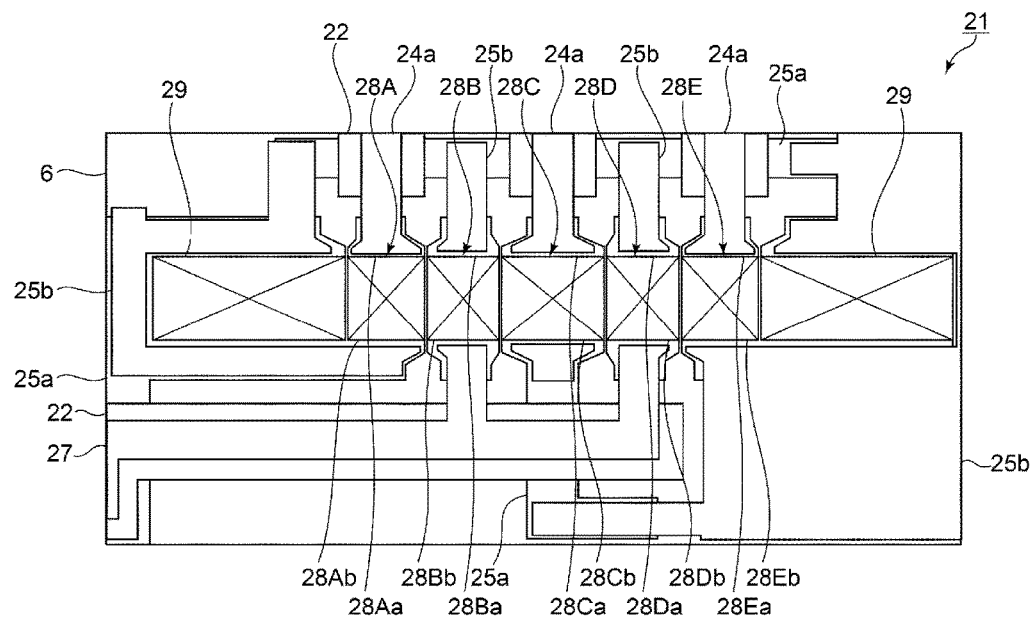
FIG. 11 is a partially cutout plan view schematically illustrating an elastic wave device according to the second preferred embodiment of the present invention.

FIG. 11 is a partially cutout plan view schematically illustrating an elastic wave device according to the second preferred embodiment of the present invention. FIG. 10 is a partially cutout plan view schematically illustrating a state in which a manufacture process of the elastic wave device of the second preferred embodiment is in a midway stage. To be more specific, FIG. 10 is a partially cutout plan view schematically illustrating a state in which a first conductive film is provided on a piezoelectric film.

An elastic wave device 21 differs from the elastic wave device of the first preferred embodiment in that it is a longitudinally coupled resonator elastic wave filter. The second preferred embodiment has the same or similar configuration as the first preferred embodiment, except for the above-mentioned difference.

As shown in FIG. 10, IDT electrodes 28A to 28E, reflectors 29, and first ground wiring 25*a* are provided on a piezoelectric film 6. The IDT electrodes 28A to 28E, the reflectors 29, and the first ground wiring 25*a* are each defined by a first conductive film provided on the piezoelectric film 6.

The IDT electrodes 28A to 28E are arranged in the surface acoustic wave propagation direction of the IDT electrodes 28A to 28E. The IDT electrodes 28A to 28E respectively include first end portions 28Aa to 28Ea and second end portions 28Ab to 28Eb. The first end portions 28Aa to 28Ea and the second end portions 28Ab to 28Eb oppose each other. The reflectors 29 are provided on both sides in the surface acoustic wave propagation direction of the IDT electrodes 28A to 28E. The elastic wave device 21 is a longitudinally coupled resonator elastic wave filter including the IDT electrodes 28A to 28E and the reflectors 29.

The first ground wiring 25*a* is electrically connected to a ground potential. The first ground wiring 25*a* includes a portion connected to the reflectors 29 and the second end portions 28Ab, 28Cb and 28Eb of the IDT electrodes 28A, 28C and 28E. The first ground wiring 25*a* does not establish any connection between the IDT electrodes.

As in the first preferred embodiment, in a process after having provided the first conductive film, a second conductive film is provided. FIG. 11 illustrates a configuration in which the second conductive film is provided.

As shown in FIG. 11, a second ground wiring 25*b* defined by the second conductive film is provided on the first ground wiring 25*a* and the piezoelectric film 6. The second ground wiring 25*b* is connected to the first ground wiring 25*a*. The first ground wiring 25*a* and the second ground wiring 25*b* each include a portion connected to the ground potential. With this, the first ground wiring 25*a* and second ground wiring 25*b* are electrically connected to the ground potential.

The first end portions 28Ba and 28Da of the IDT electrodes 28B and 28D are connected to the second ground wiring 25*b*. Also in this preferred embodiment, as in the first preferred embodiment, the second conductive film extends to the busbars of the respective IDT electrodes.

An insulation film 22 is laminated on the piezoelectric film 6 and the first ground wiring 25*a*. Hot-side wiring 24*a* defined by the second conductive film is provided on the piezoelectric film 6 and the insulation film 22. The hot-side wiring 24*a* is connected to the first end portions 28Aa, 28Ca, and 28Ea of the IDT electrodes 28A, 28C, and 28E. The hot-side wiring is also connected to the second end portions 28Bb and 28Db of the IDT electrodes 28B and 28D. The hot-side wiring to which the IDT electrode 28B and the IDT electrode 28D are connected is also connection wiring 27 connecting the IDT electrode 28B and the IDT electrode 28D. That is, the connection wiring 27 is defined by the second conductive film.

As shown in FIG. 11, the hot-side wiring 24*a* and the connection wiring 27 are provided at a position overlapping with the first ground wiring 25*a*, with the insulation film 22 interposed therebetween in plan view. In other words, three-dimensional wiring is providing in which the hot-side wiring 24*a* as well as the connection wiring 27 and the first ground wiring 25*a* are laminated with the insulation film 22 interposed therebetween. With this configuration, an area required to provide the first and second ground wirings 25*a* and 25*b*, the hot-side wiring 24*a*, and the connection wiring 27 is able to be reduced, so as to achieve miniaturization.

It is sufficient that the insulation film 22 is provided at least at a position where the first ground wiring 25*a* and the hot-side wiring 24*a* as well as the connection wiring 27 overlap with each other in plan view.

The connection wiring 27 is defined by the second conductive film and includes a portion that is not laminated on the first conductive film. As shown in FIG. 10, among the IDT electrodes 28A to 28E, none of the IDT electrodes is connected to each other by the first conductive film. This makes it possible to reduce the area of the first conductive film. In other words, the area of the IDT electrode and the electrodes formed simultaneously with the IDT electrode described in the area ratio is reduced. Accordingly, surge breakdown of the IDT electrode is unlikely to occur and ripples are unlikely to be generated in the pass band.

In the present preferred embodiment, as discussed above, the first ground wiring 25*a* provides the three-dimensional wiring and achieves miniaturization. Note that the first ground wiring 25*a* may not be provided. This makes it possible to further reduce the area of the first conductive film. As a result, the surge breakdown of the IDT electrode is more unlikely to occur and the ripples are more unlikely to be generated in the pass band.

A third preferred embodiment of the present preferred embodiment will be described with reference to FIGS. 12 and 13.

Figure 12:
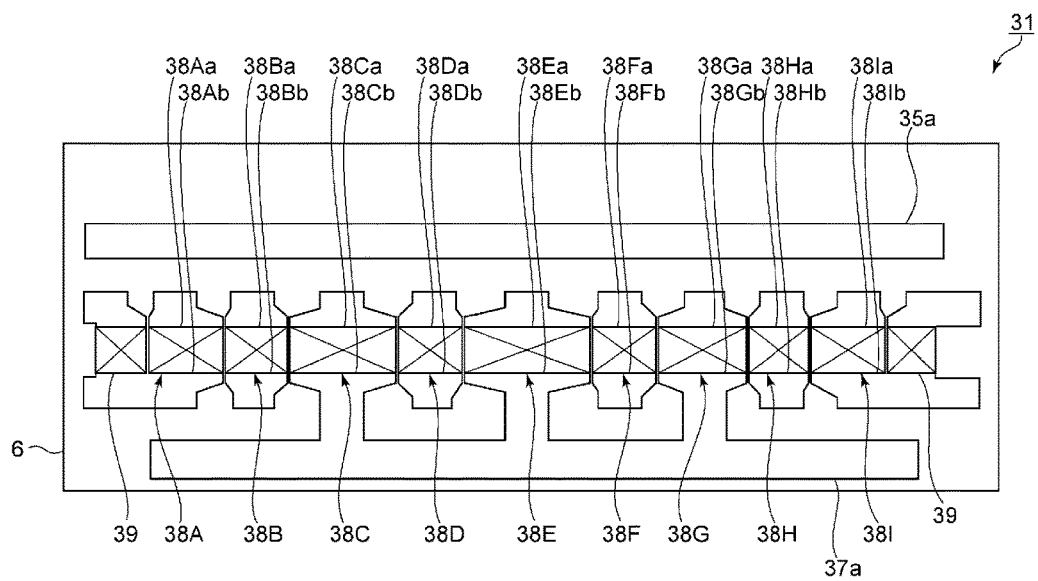
FIG. 12 is a partially cutout plan view schematically illustrating a state in which a first conductive film is provided on a piezoelectric film according to a third preferred embodiment of the present invention.
Figure 13:
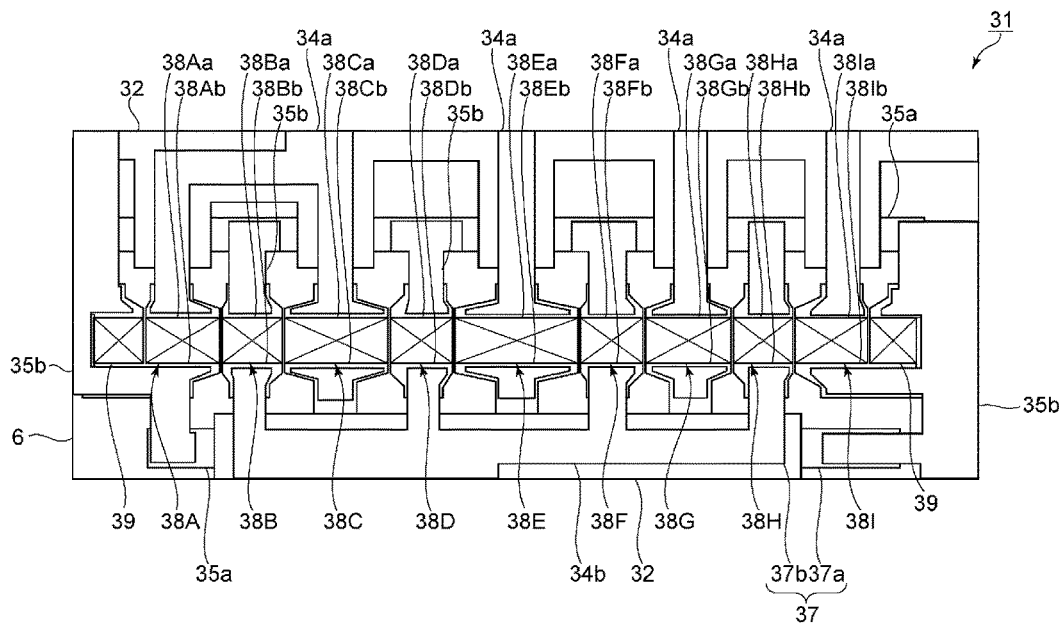
FIG. 13 is a partially cutout plan view schematically illustrating an elastic wave device according to the third preferred embodiment of the present invention.

FIG. 13 is a partially cutout plan view schematically illustrating an elastic wave device according to the third preferred embodiment of the present invention. FIG. 12 is a partially cutout plan view schematically illustrating a state in which a manufacture process of the elastic wave device of the third preferred embodiment is in a midway stage. To be more specific, FIG. 12 is a partially cutout plan view schematically illustrating a state in which a first conductive film is provided on a piezoelectric film.

An elastic wave device 31 differs from the elastic wave device of the second preferred embodiment in that the connection wiring 37 includes a portion that is defined by the first conductive film, a longitudinally coupled resonator elastic wave filter includes nine IDT electrodes, and an electrode structure is different resulting from the nine IDT electrodes being included. The third preferred embodiment has the same or similar configuration as the second preferred embodiment except for the above-mentioned differences.

As shown in FIG. 12, IDT electrodes 38A to 38I, reflectors 39, and first ground wiring 35a are provided on a piezoelectric film 6. The IDT electrodes 38A to 38I, the reflectors 39, and the first ground wiring 35a are each defined by the first conductive film provided on the piezoelectric film 6.

The IDT electrodes 38A to 38I are arranged in the surface acoustic wave propagation direction of the IDT electrodes 38A to 38I. The IDT electrodes 38A to 38I respectively include first end portions 38Aa to 38Ia and second end portions 38Ab to 38Ib. The first end portions 38Aa to 38Ia and the second end portions 38Ab to 38Ib oppose each other. The reflectors 39 are provided on both sides in the surface acoustic wave propagation direction of the IDT electrodes 38A to 38I. The elastic wave device 31 is a longitudinally coupled resonator elastic wave filter including the IDT electrodes 38A to 38I and the reflectors 39.

The first ground wiring 35a is electrically connected to a ground potential. The first ground wiring 35a includes a portion that is connected to the reflectors 39 and the second end portions 38Ab, 38Cb, 38Eb, 38Gb, and 38Ib of the IDT electrodes 38A, 38C, 38E, 38G, and 38I. The first ground wiring 35a also includes a portion connecting the IDT electrodes 38C, 38E, and 38G. The portion of the first ground wiring 35a connecting the IDT electrodes 38C, 38E, and 38G is also a first wiring section 37a of the connection wiring to be explained later.

As in the second preferred embodiment, in a process after the first conductive film having been provided, a second conductive film is provided. FIG. 13 illustrates a configuration in which the second conductive film is provided.

As shown in FIG. 13, second ground wiring 35b defined by the second conductive film is provided on the first ground wiring 35a and the piezoelectric film 6. The second ground wiring 35b is connected to the first ground wiring 35a. The second ground wiring 35b includes a portion to be connected to the ground potential. With this, the first and second ground wirings 35a and 35b are electrically connected to the ground potential.

The first end portions 38Ba, 38Da, 38Fa, and 38Ha of the IDT electrodes 38B, 38D, 38F, and 38H are connected to the second ground wiring 35b. Also in this preferred embodiment, as in the second preferred embodiment, the second conductive film extends to the busbars of the respective IDT electrodes.

An insulation film 32 is laminated on the piezoelectric film 6 and the first ground wiring 35a. Hot-side wiring 34a and hot-side wiring 34b defined by the second conductive film are provided on the piezoelectric film 6 and the insulation film 32. The hot-side wiring 34a is connected to the first end portions 38Aa, 38Ca, 38Ea, 38Ga, and 38Ia of the IDT electrodes 38A, 38C, 38E, 38G, and 38I. The hot-side wiring 34b is connected to the second end portions 38Bb, 38Db, 38Fb, and 38Hb of the IDT electrodes 38B, 38D, 38F, and 38H.

The hot-side wiring 34b is also the connection wiring 37 connecting the IDT electrodes 38B, 38D, 38F, and 38H. More specifically, in the present preferred embodiment, the connection wiring 37 includes the first wiring section 37a defined by the first conductive film and a second wiring section 37b defined by the second conductive film. The connection wiring 37 includes a portion, in the second wiring section 37b, that is not laminated on the first conductive film. The IDT electrodes 38B, 38D, 38F, and 38H are connected by the second wiring section 37b of the connection wiring 37. As shown in FIG. 12, the IDT electrodes 38C, 38E, and 38G are connected by the first wiring section 37a.

As shown in FIG. 13, the insulation film 32 is laminated on the first wiring section 37a, and the second wiring section 37b is laminated on the insulation film 32. The hot-side wiring 34a is provided at a position overlapping with the first ground wiring 35a that is not directly connected to the IDT electrodes 38C, 38E, and 38G with the insulation film 32 interposed therebetween in plan view. With this, as in the second preferred embodiment, an area required to provide the first and second ground wirings 35a, 35b and the hot-side wirings 34a, 34b is significantly reduced. This makes it possible to achieve miniaturization.

The IDT electrodes 38B, 38D, 38F, and 38H are connected by the second wiring section 37b of the connection wiring 37. As shown in FIG. 12, no portion of the first conductive film to connect the IDT electrodes 38B, 38D, 38F, and 38H is provided. In this manner, even if the connection wiring 37 includes the first wiring section 37a, the area of the first conductive film is able to be reduced. As such, the IDT electrode surge breakdown is unlikely to occur and the ripples are unlikely to be generated in the pass band.

Figure 14:
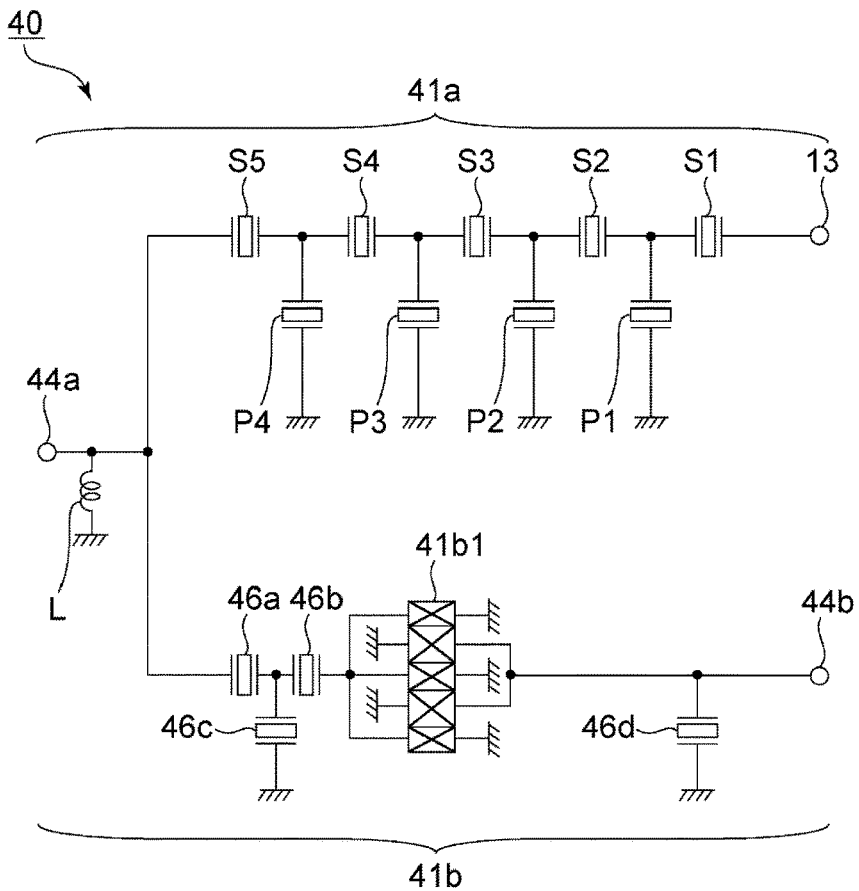
FIG. 14 is a circuit diagram of an elastic wave device according to a fourth preferred embodiment of the present invention.

FIG. 14 is a circuit diagram of an elastic wave device according to a fourth preferred embodiment of the present invention.

An elastic wave device 40 of the fourth preferred embodiment is a duplexer including a first band pass filter 41a and a second band pass filter 41b with a pass band that is different from that of the first band pass filter 41a. The fourth preferred embodiment has the same or similar configuration as the first preferred embodiment except for the above-mentioned differences.

The elastic wave device 40 includes an antenna terminal 44a provided on a piezoelectric film, an input terminal 13, and an output terminal 44b. The antenna terminal 44a is connected to an antenna. The antenna terminal 44a includes an input terminal function and an output terminal function. A signal inputted from the input terminal 13 is outputted from the antenna terminal 44a. A signal inputted from the antenna terminal 44a is outputted from the output terminal 44b. An impedance matching inductor L is connected between the antenna terminal 44a and a ground potential.

The first band pass filter 41a is a ladder filter. Between the input terminal 13 and the antenna terminal 44a, serial arm resonators S1 to S5 are connected to each other in series. Except for the above difference, the first band pass filter 41a is a ladder filter having the same or similar configuration as the elastic wave device 1 of the first preferred embodiment.

The second band pass filter 41b includes a longitudinally coupled resonator elastic wave filter 41b1 and resonators 46a to 46d that provides characteristics adjustment. The longitudinally coupled resonator elastic wave filter 41b1 has the same or similar configuration as the elastic wave device 21 of the second preferred embodiment. Between the antenna terminal 44a and the longitudinally coupled resonator elastic wave filter 41b1, the resonators 46a and 46b are connected to each other in series. The resonator 46c is connected between the ground potential and a connection point between the resonators 46a, 46b. The resonator 46d is connected between an output end of the longitudinally coupled resonator elastic wave filter 41b1 and the ground potential.

The present preferred embodiment can also obtain the same or similar effects as the first and second preferred embodiments. Note that both of the first and second band pass filters may be ladder filters or longitudinally coupled resonator elastic wave filters, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
a piezoelectric film;
a high acoustic velocity member in which an acoustic velocity of a bulk wave propagating in the high acoustic velocity member is larger than an acoustic velocity of a main mode elastic wave propagating in the piezoelectric film, the piezoelectric film being directly or indirectly laminated on the high acoustic velocity member;
a first conductive film provided on the piezoelectric film; and
a second conductive film provided on the piezoelectric film and on at least a portion of the first conductive film; wherein
a plurality of IDT electrodes including electrode fingers and busbars are provided on the piezoelectric film, and at least the electrode fingers of the plurality of IDT electrodes are defined by the first conductive film; and
at least a portion of connection wiring with which the plurality of IDT electrodes are connected to each other is defined by the second conductive film.

2. The elastic wave device according to claim 1, wherein the piezoelectric film is directly laminated on the high acoustic velocity member.

3. The elastic wave device according to claim 1, wherein a close contact layer is provided between the high acoustic velocity member and the piezoelectric film.

4. The elastic wave device according to claim 1, further comprising:
a low acoustic velocity film laminated on the high acoustic velocity member and in which an acoustic velocity of a bulk wave propagating in the low acoustic velocity film is smaller than the acoustic velocity of the main mode elastic wave propagating in the piezoelectric film; wherein
the piezoelectric film is indirectly laminated on the high acoustic velocity member with the low acoustic velocity film interposed between the piezoelectric film and the high acoustic velocity member.

5. The elastic wave device according to claim 1, wherein all of the connection wiring is defined by the second conductive film.

6. The elastic wave device according to claim 1, wherein the connection wiring includes a first wiring section defined by the first conductive film, the first wiring section establishing connection between the IDT electrodes;
the elastic wave device further includes an insulation film provided on the first wiring section; and
a portion of the second conductive film is provided on the insulation film.

7. The elastic wave device according to claim 1, wherein the electrode fingers and the busbars are defined by the first conductive film.

8. The elastic wave device according to claim 1, wherein the electrode fingers are defined by the first conductive film, the busbars are defined by the second conductive film, and the busbars overlap with end portions of the electrode fingers.

9. The elastic wave device according to claim 1, wherein the high acoustic velocity member is defined by a high acoustic velocity film; and
the elastic wave device further includes a support substrate provided on a surface of the high acoustic velocity film on an opposite side to a surface of the high acoustic velocity film on which the low acoustic velocity film is provided.

10. The elastic wave device according to claim 9, wherein the support substrate is made of Si.

11. The elastic wave device according to claim 9, further comprising a bonding film laminated on the support substrate and bonding the support substrate to the high acoustic velocity film.

12. The elastic wave device according to claim 11, wherein the bonding film is made of $SiO_2$.

13. The elastic wave device according to claim 1, wherein the high acoustic velocity member is defined by a high acoustic velocity substrate.

14. The elastic wave device according to claim 1, wherein the elastic wave device is a ladder filter including a serial arm resonator and a parallel arm resonator; and
at least one of the serial arm resonator and the parallel arm resonator includes the plurality of IDT electrodes.

15. The elastic wave device according to claim 1, wherein the elastic wave device is a longitudinally coupled resonator elastic wave filter.

16. The elastic wave device according to claim 1, further comprising a protection film provided on the plurality of IDT electrodes.

17. The elastic wave device according to claim 16, wherein the protection film is made of $SiO_2$ and has a thickness about 25 nm.

18. A duplexer comprising:
a first band pass filter and a second band pass filter with a pass band that is different from a pass band of the first band pass filter; wherein
at least one of the first and second band pass filters is the elastic wave device according to claim 1.

* * * * *